(12) United States Patent
Otsuka et al.

(10) Patent No.: US 9,520,311 B2
(45) Date of Patent: Dec. 13, 2016

(54) PROCESSING FACILITY

(71) Applicant: Daifuku Co., Ltd., Osaka-shi (JP)

(72) Inventors: Hiroshi Otsuka, Gamo-gun (JP);
Shinsuke Kawamura, Gamo-gun (JP);
Tadahiro Yoshimoto, Gamo-gun (JP)

(73) Assignee: Daifuku Co., Ltd., Osaka-shi (JP)

( * ) Notice: Subject to any disclaimer, the term of this patent is extended or adjusted under 35 U.S.C. 154(b) by 30 days.

(21) Appl. No.: 14/308,047

(22) Filed: Jun. 18, 2014

(65) Prior Publication Data

US 2015/0000789 A1 Jan. 1, 2015

(30) Foreign Application Priority Data

Jun. 26, 2013 (JP) ................ 2013-134264

(51) Int. Cl.
*H01L 21/673* (2006.01)
*H01L 21/677* (2006.01)

(52) U.S. Cl.
CPC ... *H01L 21/67389* (2013.01); *H01L 21/67393* (2013.01); *H01L 21/67769* (2013.01)

(58) Field of Classification Search
CPC .............. H01L 21/67376; H01L 21/67389; H01L 21/67393; H01L 21/67379
USPC ......... 141/63, 65, 66, 349; 414/222.01, 940, 414/937, 939; 55/385.2; 206/710–712
See application file for complete search history.

(56) References Cited

U.S. PATENT DOCUMENTS

| | | | |
|---|---|---|---|
| 5,988,233 A * | 11/1999 | Fosnight et al. ................ 141/63 |
| 6,164,664 A * | 12/2000 | Fosnight et al. .............. 277/635 |
| 6,199,604 B1 * | 3/2001 | Miyajima ....................... 141/98 |
| 6,364,152 B1 * | 4/2002 | Poslinski et al. ............. 220/788 |
| 8,057,151 B2 * | 11/2011 | Yokoyama et al. .......... 414/411 |
| 8,146,623 B2 * | 4/2012 | Tieben et al. .................... 141/63 |
| 8,613,359 B2 * | 12/2013 | Kolbow et al. ............... 206/710 |
| 2004/0237244 A1 * | 12/2004 | Suzuki et al. .................. 15/301 |
| 2005/0247594 A1 * | 11/2005 | Mimura et al. ............... 206/710 |
| 2007/0170089 A1 * | 7/2007 | Burns et al. .................. 206/711 |
| 2009/0033111 A1 * | 2/2009 | Hupp ........................... 294/64.1 |
| 2010/0178137 A1 * | 7/2010 | Chintalapati et al. ... 414/222.01 |
| 2011/0214778 A1 * | 9/2011 | Natsume et al. ................ 141/4 |
| 2012/0045302 A1 * | 2/2012 | Iizuka ............... H01L 21/67389 414/287 |
| 2013/0326841 A1 * | 12/2013 | Natsume et al. ............... 15/405 |
| 2014/0041755 A1 * | 2/2014 | Chou ................ H01L 21/67393 141/113 |

FOREIGN PATENT DOCUMENTS

| | | |
|---|---|---|
| JP | 2004-345715 A | 12/2004 |
| JP | 20075599 A | 1/2007 |
| JP | 2010-41015 A | 2/2010 |

(Continued)

*Primary Examiner* — Timothy L Maust
*Assistant Examiner* — Andrew Stclair
(74) *Attorney, Agent, or Firm* — The Webb Law Firm

(57) ABSTRACT

A processing facility is disclosed in which a container side contact surface and a support side contact surface are in contact with each other and a supply hole or a discharge hole, and a communicating hole are allowed to communicate with each other when a container is supported by a container support, and in which the container side contact surface is formed to be flat at least in a periphery of the communicating hole, and the support side contact surface is formed to have a shape that is gradually lower as a distance increases from the supply hole or the discharge hole.

14 Claims, 6 Drawing Sheets

(56) References Cited

FOREIGN PATENT DOCUMENTS

| JP | 2010-147451 | * | 7/2010 |
|----|-------------|---|--------|
| JP | 2010-147451 A | | 7/2010 |
| JP | 2010-182747 | * | 8/2010 |
| JP | 2011-187539 A | | 9/2011 |
| TW | 341303 | * | 9/2008 |
| WO | WO 9802352 | * | 1/1998 |
| WO | 2010104108 A1 | | 9/2010 |

* cited by examiner

PROCESSING FACILITY

CROSS-REFERENCE TO RELATED APPLICATION

This application claims priority to Japanese Patent Application No. 2013-134264 filed Jun. 26, 2013, the disclosure of which is hereby incorporated in its entirety by reference.

FIELD OF THE INVENTION

The present invention relates to a processing facility comprising a container for holding an object to be held therein, a container support for supporting the container from below with the container positioned in a set position, a container side connecting portion which is provided in a bottom portion of the container and which has a communicating hole capable of allowing communication between interior space of the container and outside the container, and a support side connecting portion which is provided to the container support and which has a supply hole for supplying gas to the interior space of the container or a discharge hole for discharging gas from the interior space of the container wherein a container side contact surface which is an undersurface of the container side connecting portion and a support side contact surface which is a top surface of the support side connecting portion are configured to be in contact with each other and to allow communication between the supply hole or the discharge hole and the communicating hole, when the container is supported by the container support.

BACKGROUND

An example of such processing facility is a purge facility that is configured to supply purge gas into the interior space of the container, or to discharge contaminating gas from the interior space of the container while the container, such as a FOUP for storing or holding semiconductor wafers, is supported on a container support, in order to prevent contamination of the semiconductor wafers stored in the container. (See, for example, JP Publication of Application No. 2010-147451 (Patent Document 1)).

In the purge facility of Patent Document 1, a support side connecting portion has, at its top end, a supply and discharge hole which is circular in shape as seen in plan view. And a sloped surface is formed in the periphery of the supply and discharge hole such that the surface is straight in a side view, and is lower as the distance increases from the supply and discharge hole. And a container side connecting portion has a communicating hole for allowing communication between the interior space of the container and its outside, and a seal portion, made of an elastic member, that is provided in the periphery of the communicating hole and that is formed such that the seal portion is in contact with the slope of the support side connecting portion at a number of points in a side view when the container is supported by the container support. Thus, the seal portion of the container side connecting portion is in contact with the slope of the support side connecting portion at a number of points in a side view when the container is supported by the container support: and the seal portion is deformed as it is pressed against the support side connecting portion by the weight of the container; thus, the contact area between the support side connecting portion and the container side connecting portion is sealed to prevent gas, such as purge gas, from leaking to outside from the contact area.

SUMMARY OF THE INVENTION

When the container side connecting portion and the support side connecting portion are provided as in the facility of Patent Document 1, the seal portion of the container side connecting portion needs to be formed such that it comes into contact with the slope at a number of points in a side view when the container is supported by the container support; which complicates the structure of the container side connecting portion.

To this end, it is conceivable to form the support side connecting portion and the container side connecting portion such that both the periphery of the supply hole or the discharge hole in the support side contact surface and the periphery of the communicating hole in the container side contact surface are formed flat so that the flat surface of the container side connecting portion and the flat surface of the support side connecting portion would contact each other over a surface when the container is supported by the container support.

However, with such arrangement, because the contact surface between the support side connecting portion and the container side connecting portion is large, the support side connecting portion and the container side connecting portion tend to adhere to each other when the container is supported by the container support for a prolonged period of time. Thus, there was a possibility that a disadvantage may occur in which, when releasing the container from its supported position in order to move the container from the container support to another location, an excessive force is applied to one or both of the support side connecting portion and the container side connecting portion, resulting in deformation of one or both of these connecting portions.

To this end, a processing facility is desired in which occurrences of the adherence between the support side connecting portion and the container side connecting portion are reduced while keeping the structure of the container side connecting portion simple.

A processing facility in accordance with the present invention comprises:

a container for holding an object to be held therein;

a container support for supporting the container from below with the container positioned in a set position;

a container side connecting portion which is provided in a bottom portion of the container and which has a communicating hole capable of allowing communication between interior space of the container and outside the container;

a support side connecting portion which is provided to the container support and which has a supply hole for supplying gas to the interior space of the container or a discharge hole for discharging gas from the interior space of the container;

wherein a container side contact surface which is an undersurface of the container side connecting portion and a support side contact surface which is a top surface of the support side connecting portion are configured to be in contact with each other and to allow communication between the supply hole or the discharge hole and the communicating hole, when the container is supported by the container support, wherein the container side contact surface is formed to be flat at least in a periphery of the communicating hole, and wherein the support side contact surface is formed to have a shape that is gradually lower as a distance increases from the supply hole or the discharge hole.

With the arrangement described above, the container side contact surface and the support side contact surface are in contact with each other in a periphery of a communicating area through which the supply hole or the discharge hole and the communicating hole communicate with each other when the container is supported by the container support so that the contact area between the support side connecting portion and the container side connecting portion is sealed to prevent gas from leaking from the contact area.

When this happens, since the support side contact surface is formed to have a shape that is gradually lower as a distance increases from the supply hole or the discharge hole, the container side contact surface and the support side contact surface is spaced apart from each other by a greater amount as the distance increases from the communicating area between the supply hole or the discharge hole and the communicating hole. Thus, the area in which the container side contact surface and the support side contact surface are in contact with each other can be made smaller; thus, the occurrences of the adherence between the support side connecting portion and the container side connecting portion is reduced even when a container is supported by the container support for a prolonged period of time.

Thus, a processing facility can be provided in which occurrences of the adherence between the support side connecting portion and the container side connecting portion are reduced while keeping the structure of the container side connecting portion simple.

Examples of preferred embodiments of the present invention are described next.

In an embodiment of the processing facility in accordance with the present invention, the support side contact surface is preferably formed to have a shape that conforms to a surface of a sphere.

With the arrangement described above, because the support side contact surface is formed to have a shape that conforms to a surface of a sphere, the support side contact surface and the container side contact surface come closer in the periphery of the communicating area between the supply hole or the discharge hole and the communicating hole.

To describe this using a comparative example, if the support side contact surface was formed to have a shape which is lower in a liner fashion as the distance increases from the supply hole or discharge hole, the contact area between the container side contact surface and the support side contact surface in the periphery of the communicating area between the supply hole or the discharge hole and the communicating hole would only be ring-shaped with a small width in the radial direction. In contrast, when the support side contact surface is formed to have a shape that conforms to a surface of a sphere, the width in the radial direction of the contact area between the container side contact surface and the support side contact surface can be made greater than the width in the comparative example. Thus, the contact area between the support side connecting portion and the container side connecting portion can be properly sealed to prevent gas from leaking from the contact area.

In an embodiment of the processing facility in accordance with the present invention, an elastic member is preferably held between the support side connecting portion and the container support, wherein the support side connecting portion is preferably made of material having an elastic modulus that is greater than an elastic modulus of the elastic member.

With the arrangement described above, the elastic member deforms elastically when the container is supported by the container support; thus, the container side contact surface and the support side contact surface can come into proper contact with each other while allowing the container to be supported stably by the container support.

In addition, even if the container vibrates while being supported by the container support, the container side contact surface and the support side contact surface remain in contact with each other because of the elastic deformation of the elastic member.

Thus, the contact area between the support side connecting portion and the container side connecting portion can be properly sealed to prevent gas from leaking from the contact area because of the elastic deformation of the elastic member.

In an embodiment of the processing facility in accordance with the present invention, a restricting member is preferably provided in a periphery of the support side connecting portion, for restricting movement of the support side connecting portion in a horizontal direction and in a vertical direction to within a range defined in advance.

With the arrangement described above, by attaching the support side connecting portion such that its movement in a horizontal direction and in a vertical direction is restricted to within a range defined in advance, the support side connecting portion can be properly attached to the container support such that the support side connection portion is prevented from moving away from a prescribed position in the container support in plan view while allowing the vertical movement of the support side connecting portion only by the amount that corresponds to the elastic deformation of the elastic member.

In an embodiment of the processing facility in accordance with the present invention, the support side connecting portion preferably includes a top portion which is circular in shape in plan view and which has the support side contact surface, a smaller diameter portion whose diameter is less than a diameter of the top portion and is greater than a diameter of the supply hole or the discharge hole, and which adjoins the top portion from below, and a leg portion whose diameter is greater than the diameter of the smaller diameter portion and which adjoins the smaller diameter portion from below, wherein the restricting member preferably has an insert portion which is thinner than a vertical dimension of the smaller diameter portion, and wherein the insert portion is provided such that the insert portion is preferably located at a height at which the insert portion overlaps with the smaller diameter portion in a side view, and such that the insert portion overlaps with both the top portion and the leg portion in plan view.

With the arrangement described above, because the insert portion is formed to be thinner than the vertical dimension of the smaller diameter portion, the support side connecting portion is allowed to move vertically by a vertical distance that corresponds to the difference between the vertical dimension of the smaller diameter portion and the vertical dimension of the insert portion. In addition, because the insert portion is inserted between the top portion and the leg portion in the vertical direction, the insert portion restricts the movement of the support side connecting portion in the vertical direction, and thus allowing the support side connecting portion to be properly attached to the container support.

Therefore, the support side connecting portion can be properly attached to the container support while allowing the support side connecting portion to move when the elastic member elastically deforms and while restricting the movement of the support side connecting portion in the vertical direction.

In an embodiment of the processing facility in accordance with the present invention, a surface roughness of the support side contact surface is preferably such that an arithmetic mean roughness (Ra) is within a range of 3.2 micrometers to 6.3 micrometers.

With the arrangement described above, the smaller the surface roughness of the support side contact surface is, the easier it becomes for the support side connecting portion and the container side connecting portion to adhere to each other. On the other hand, the larger the surface roughness of the support side contact surface is, more likely it becomes for gas to leak from between the contact surfaces even when the support side contact surface and the container side contact surface are in contact with each other. And as a result of dedicated and repeated research taking into such consideration as the relevance of the weight of the container and of the supply pressure of the gas supplied into the interior space from the supply hole, the surface roughness of the support side contact surface may be such that its arithmetic mean roughness (Ra) is within a range of 3.2 micrometers to 6.3 micrometers.

Thus, a processing facility can be provided in which the contact area between the support side connecting portion and the container side connecting portion can be properly sealed to prevent gas from leaking from the contact area while properly reducing the adherence between the support side connecting portion and the container side connecting portion by having the surface roughness of the support side contact surface which is 3.2 micrometers-6.3 micrometers in terms of the arithmetic mean roughness (Ra).

DETAILED DESCRIPTION

An embodiment is described next in which a processing facility of the present invention is utilized in a substrate container storage facility, with reference to the drawings.

Figure 1:
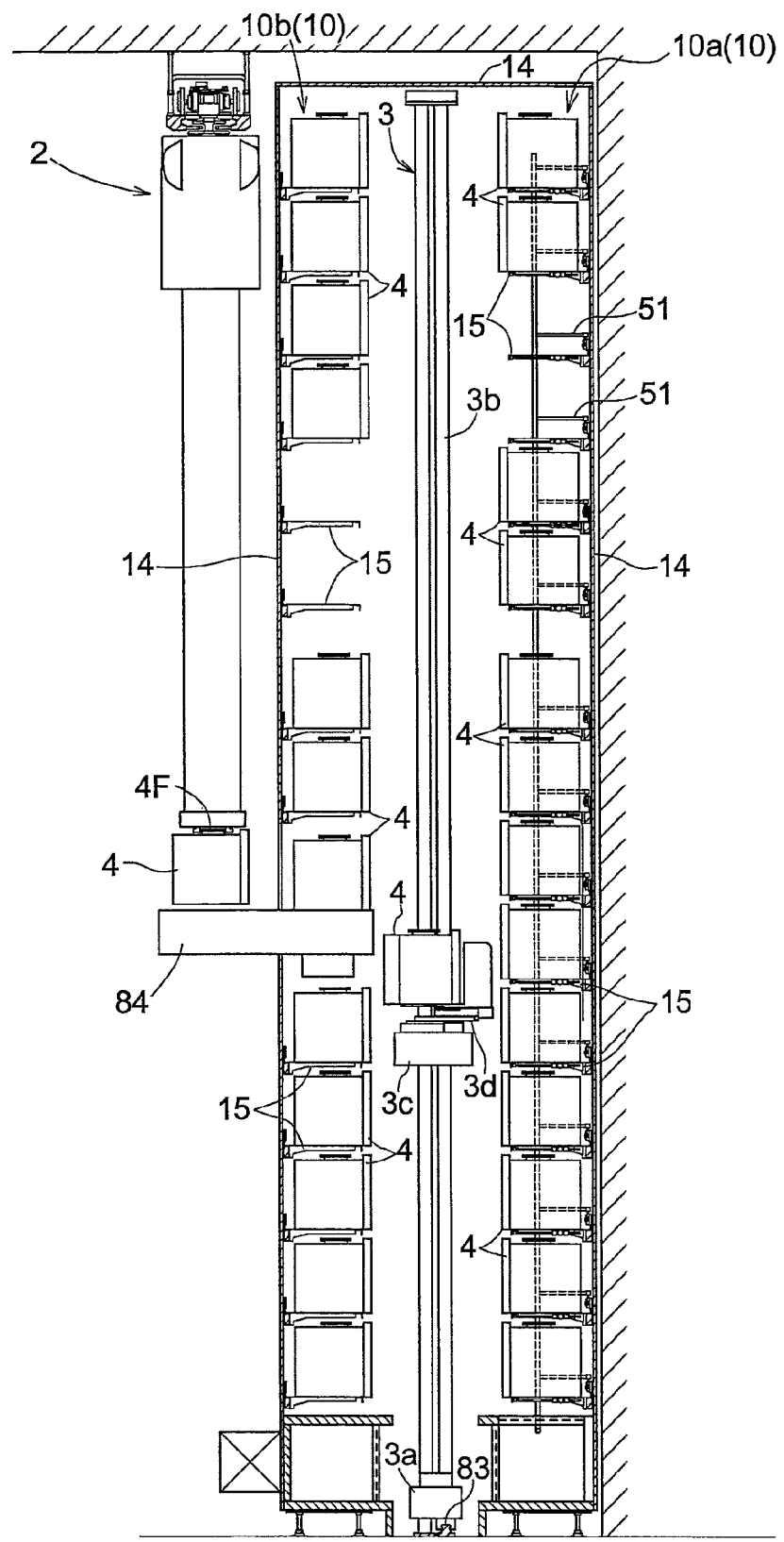
FIG. 1 is a vertical sectional side view showing the structure of a substrate container storage facility in accordance with an embodiment of the present invention.
Figure 2:
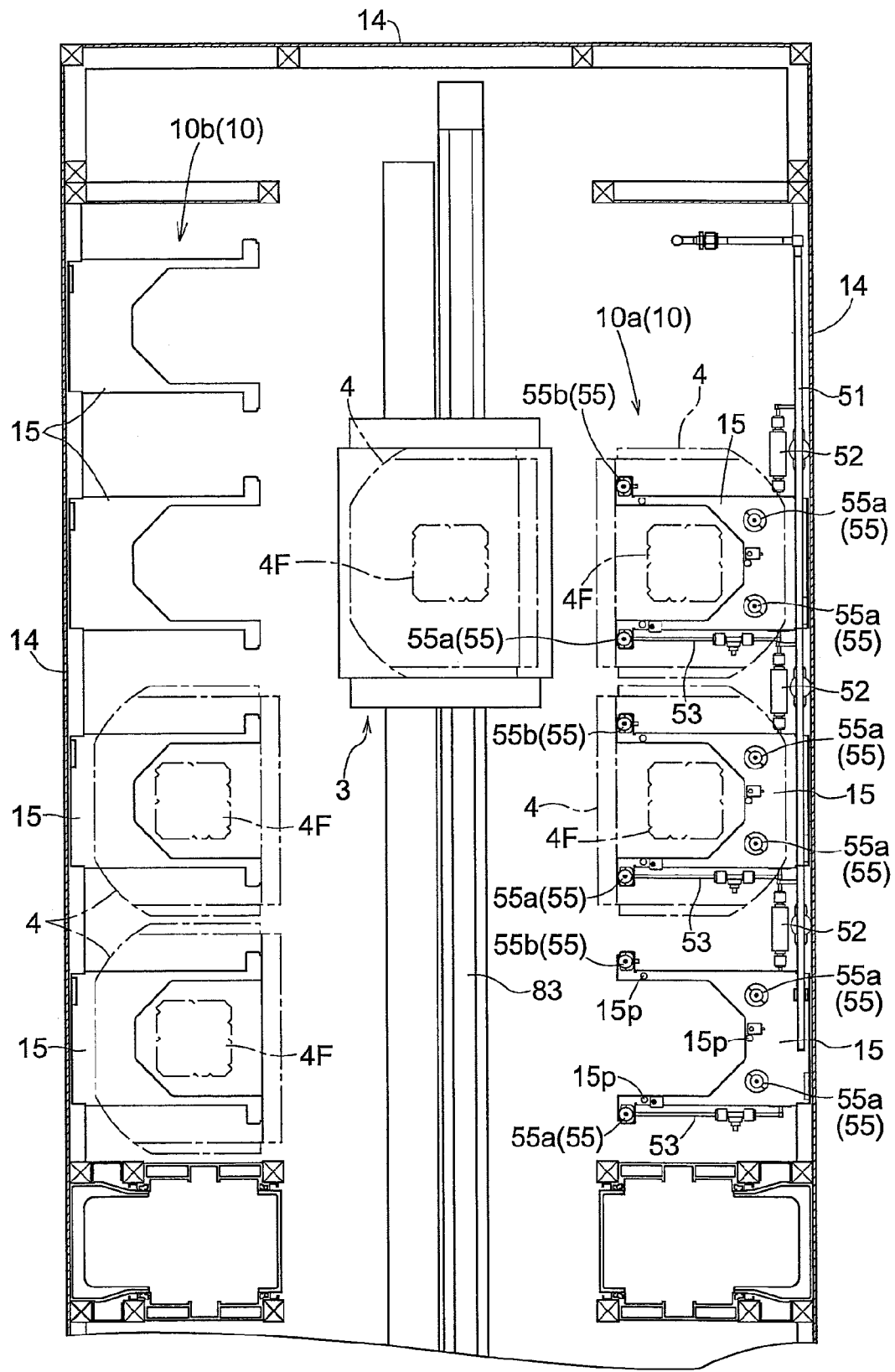
FIG. 2 is a partial plan view of the facility.

As shown in FIGS. 1 and 2, a substrate container storage facility includes storage racks 10 each having container supports 15 each of which is configured to support a container 4, such as a FOUP, for holding or storing semiconductor wafers in a sealed environment therein with a plurality of the container supports 15 arranged both in the vertical direction and in the lateral direction (or right and left direction), and a stacker crane 3 which can travel along a travel rail 83 installed in front of a front face of each storage rack 10 and which can transfer containers 4 one at a time.

The stacker crane 3 includes a travel carriage 3a having travel wheels (not shown) which rotate and move on the travel rail 83, a vertical movement guiding mast 3b provided to stand vertically on the travel carriage 3a, and a vertically movable platform 3c which can be moved vertically or up and down while being guided by the vertical movement guiding mast 3b. The vertically movable platform 3c is provided with a transfer device 3d of the SCARA (Selective Compliance Assembly Robot Arm or Selective Compliance Articulated Robot Arm) type, which can transfer a container 4 to or from a container support 15. The transfer device 3d is configured to be able to transfer a container 4, and to be able to switch or move between a retracted position at which the transfer device 3d overlaps with the vertically movable platform 3c in plan view and a projected position at which the transfer device 3d is projected toward the container support 15.

A pair of storage racks 10 is provided such that the front face of one of the racks 10 faces the front face of the other. One of the pair of storage racks 10 is configured to be a purge rack 10a to which support side connecting portions (described below) are provided. Here, each support side connecting portion has a supply hole for supplying inactive gas, such as nitrogen gas, to the interior space of the container 4, in order to prevent the semiconductor wafers in the container 4 from being contaminated, or a discharge hole for discharging gas in the container from the interior space of the container 4. The other of the pair of storage racks 10 is configured to be a non-purge rack 10b to which no support side connecting portion is provided. The transfer device 3d of the stacker crane 3 is configured to be able to transfer the container 4 to or from any of the container supports 15 of the purge rack 10a, and to or from any of the container supports 15 of the non-purge rack 10b.

The purge rack 10a, the non-purge rack 10b, and the stacker crane 3 are installed in the space enclosed by walls 14. In addition, a carry in and out conveyor 84 for transporting a container 4 between the interior of the walls 14 and the outside the walls 14 is provided such that the conveyor 84 extends through one of the walls 14. One end of the carry in and out conveyor 84 that is outside the wall 14 is a transfer location at which the container 4 is transferred to or from a hoist type inter-facility container transport device 2. The end of the carry in and out conveyor 84 that is inside the wall 14 is a transfer location at which the container 4 is transferred to or from the transfer device 3d of the stacker crane 3.

Figure 4:
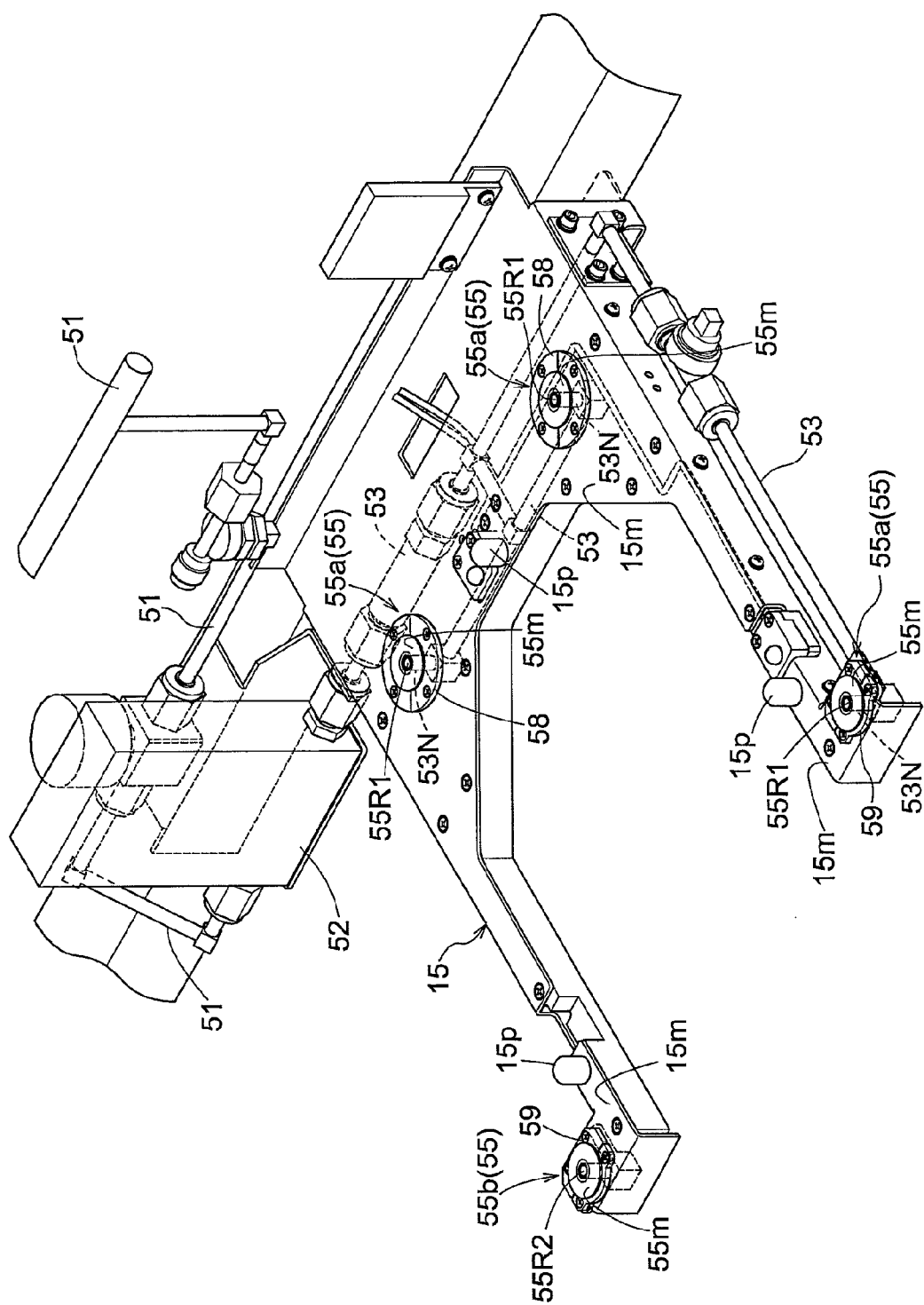
FIG. 4 is a perspective view of a container support in accordance with an embodiment of the present invention.

As shown in FIG. 4, the container support 15 is formed to have a U-shape in plan view so as to form space through which the transfer device 3d can move or pass vertically. And the container support 15 has upright positioning pins 15p with one located at each of three locations in its top surface. When transferring the container 4 to a container support 15, the vertically movable platform 3c is vertically moved such that the height, or the vertical position, of the undersurface of the container 4 supported by the transfer device 3d is higher, by a set height, or a vertical dimension, than the height of the container support 15 which is the transfer target. Then the transfer device 3d is switched or moved to its projected position, followed by the lowering of the vertically movable platform 3c until the height of the undersurface of the container 4 would have been lower, by a set height, or a vertical dimension, than the height of the container support 15 which is the transfer target if the container support 15 did not exist, after the container 4 comes to be received and supported by the container support 15. In this manner, the container 4 is moved from a state or a position in which it is supported by the transfer device 3d to a state or a position in which it is supported by the container support 15.

Figure 3:
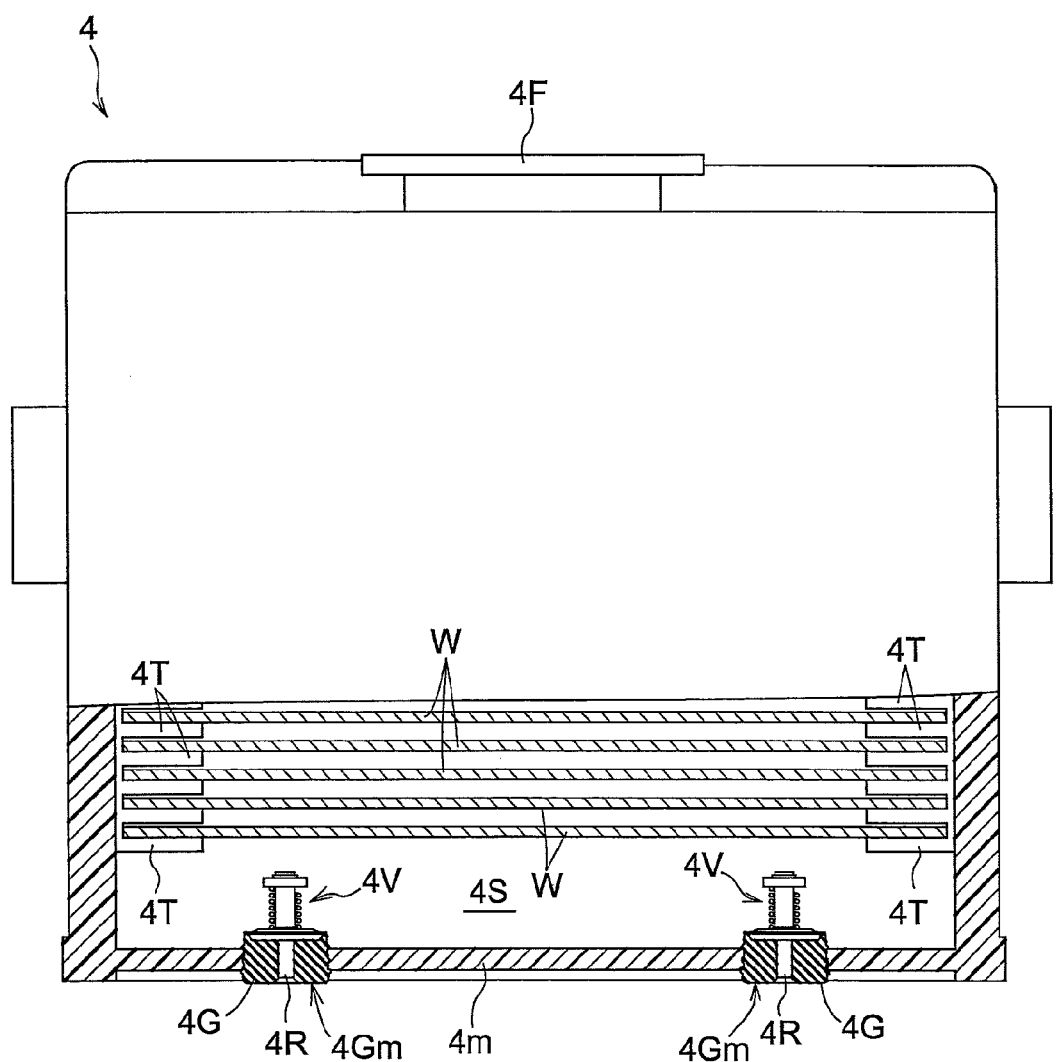
FIG. 3 is partial cutout explanatory drawing of a container in accordance with an embodiment of the present invention.

As shown in FIG. 3, each container 4 is an airtight container made of synthetic resin and in compliance with the SEMI (Semiconductor Equipment and Materials International) standard, and has a plurality of wafer supports 4T which are configured to hold or store semiconductor wafers W and which are arranged, and spaced apart from each other, in the vertical direction, and thus is configured to be able to store a plurality of semiconductor wafers W. An opening for inserting and retrieving substrates, which can be opened and closed by a lid that can be attached and detached, is formed in the front face of the container 4. A top flange 4F configured to be gripped by the inter-facility container transport device 2 is formed in the top surface of the container 4. And three guiding recessed portions (not shown), with each of which the corresponding one of the three positioning pins 15p (see FIG. 4) provided in the top surface of the container support 15 engages, are formed in the bottom portion 4m of the container 4. Each guiding recessed portion is shaped such that the portion of the guiding recessed portion which the upper end of the corresponding positioning pin 15p contacts when the container 4 is in a set position is the deepest portion, and such that the rest of the guiding recessed portion defines a sloped guided surface that is gradually shallower toward its periphery. Therefore, as the container 4 is lowered to place it on, and to have it supported by, the container support 15, the container 4 is gradually moved into the set position in a direction along a horizontal plane, or the horizontal direction. That is, containers 4 for holding or storing semiconductor wafers W and container supports 15 each of which supports a container 4 from below with the container 4 properly positioned in the set position are provided.

As shown in FIG. 3, the bottom portion of the container 4 is provided with grommets 4G each of which has a communicating hole 4R for supplying nitrogen gas into the interior space 4S of the container. Each grommet 4G is formed to be circular in shape in plan view, and the communicating hole 4R is formed at the center of the circle in plan view. In addition, a container side contact surface 4Gm which is flat is formed in the periphery of the communicating hole 4R in the undersurface of the grommet 4G. In addition, an opening and closing valve mechanism 4V which is urged in its closing direction by urging means, such as a spring, is provided within the grommet 4G. The opening and closing valve mechanism 4V is configured to be opened only when the pressure of the gas supplied through the communicating hole 4R or of the gas discharged through the communicating hole 4R becomes greater than or equal to a set pressure. In present embodiment, the grommet 4G functions as a container side connecting portion which has the communicating hole 4R which can allow communication between the interior space of the container and the outside.

As shown in FIG. 4, each the container support 15 has a total of four support side connecting portions 55 with two located toward the back of the storage rack 10 and two located toward the front of the storage rack 10, as seen from the front of the storage rack 10. The two support side connecting portions 55a located toward the back of the storage rack 10 and the one located on the right and toward the front are support side connecting portions 55a each with a supply hole 55R1 for supplying purge gas to the interior space 4S of the container 4. And the one located on the left and toward the front is the support side connecting portion 55b that has a discharge hole 55R2 for discharging the gas from the interior space 4S.

Figure 5:
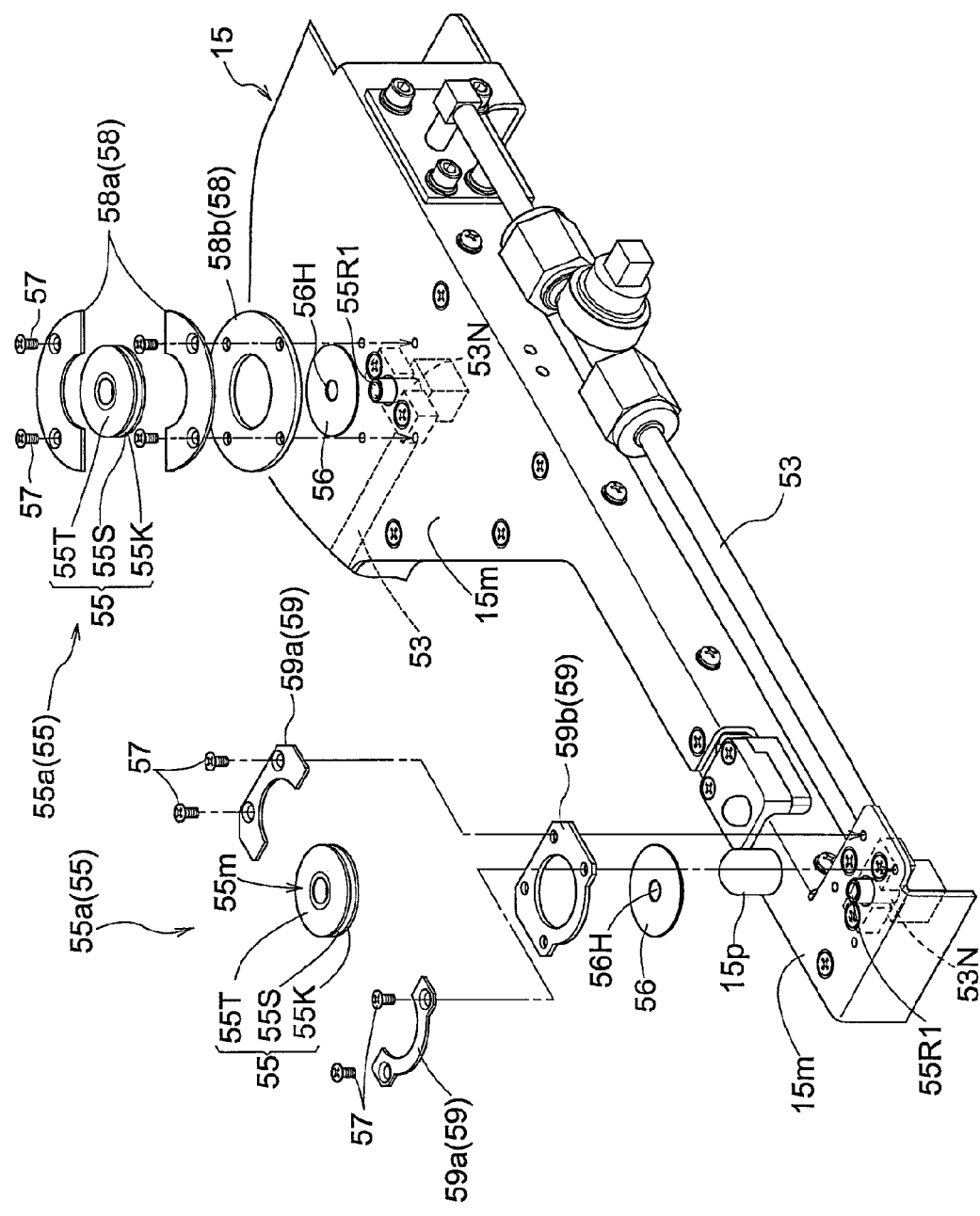
FIG. 5 is a perspective view showing a principal part of a support side connecting portion and its attachment structure in accordance with an embodiment of the present invention.

As shown in FIGS. 4 and 5, a supply pipe 51 which supplies inactive gas to each of the container supports 15 in the purge rack 10a individually is provided. And the supply pipe 51 is connected to an inflow side connecting portion of a supply flow rate adjusting device 52. In addition, a container supply pipe 53 is connected to an outflow side connecting portion of the supply flow rate adjusting device 52. The container supply pipe 53 is connected to a supply nozzle 53N which projects upwardly from the top surface 15m of the container support 15 at the position where the support side connecting portion 55a is located in the container support 15 so that inactive gas is ejected from the supply nozzle 53N.

In addition, a discharge nozzle (not shown) which projects upwardly from the top surface 15m of the container support 15 is provided at the position where the support side connecting portion 55b is located in the container support 15. The dimension (the amount of vertical projection) of the portion of the discharge nozzle that projects upwardly from the top surface 15m of the container support 15 is defined to be the same as the dimension of the corresponding portion of the supply nozzle 53N. In addition, the discharge nozzle is open on the downstream side with respect to a direction in which gas flows; and, the gas from the interior space 4S of the container 4 is released from this opening.

The supply nozzle 53N fits into the supply hole 55R1 described above such that the supply nozzle 53N can slide with respect to the supply hole 55R1. And the inactive gas is ejected through the supply hole 55R1. The discharge nozzle fits into the discharge hole 55R2 such that the discharge nozzle can slide with respect to the discharge hole 55R2. And gas is discharged from the interior space 4S of the container 4 through the discharge hole 55R2. The vertical dimension of the portion of the support side connecting portion 55 that forms the supply hole 55R1 and the vertical dimension of the portion of the support side connecting portion 55 that forms the discharge hole 55R2 are at least greater than the projection heights of the supply nozzle 53N and the discharge nozzle (i.e., the amount the supply nozzle 53 projects vertically, and amount the discharge nozzle projects vertically) from the top surface 15m of the container support 15.

Since the support side connecting portion 55a and the support side connecting portion 55b are identical in structure, they will be described together hereinafter as the support side connecting portion 55.

Figure 6:
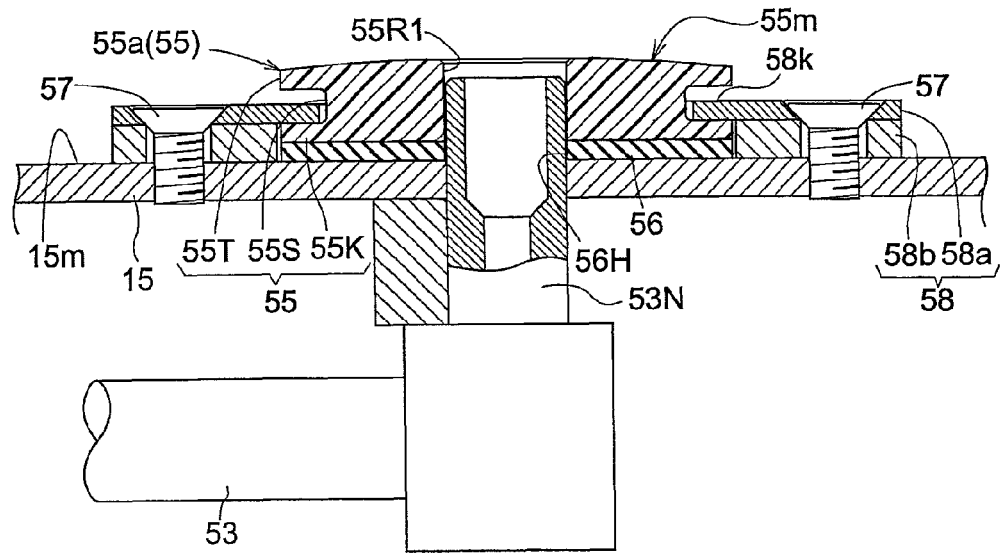
FIG. 6 is a vertical sectional side view of the support side connecting portion in accordance with an embodiment of the present invention.

The support side connecting portion 55 is made of polytetrafluoroethylene (PTFE), is formed to be circular in shape in plan view as shown in FIGS. 5 and 6, and is configured such that, when the container 4 is supported by the container support 15, the container side contact surface 4Gm which is the undersurface of the grommet 4G and the support side contact surface 55m which is the top surface of the support side connecting portion 55 are in contact with each other, at which time, the supply hole 55R1 and the communicating hole 4R are in communication with each other (which is also true for the discharge hole 55R2).

The support side contact surface 55m is formed to have a shape that conforms to the surface of a sphere that is upwardly convex. That is, the support side contact surface 55m is formed to have a shape which is gradually lower as the distance increases from the supply hole 55R1 or the discharge hole 55R2. In addition, the support side contact surface 55m is formed such that its surface roughness is in the range of 3.2 micrometers to 6.3 micrometers in terms of Ra (i.e., arithmetic mean roughness defined in JIS B0601).

Figure 7:
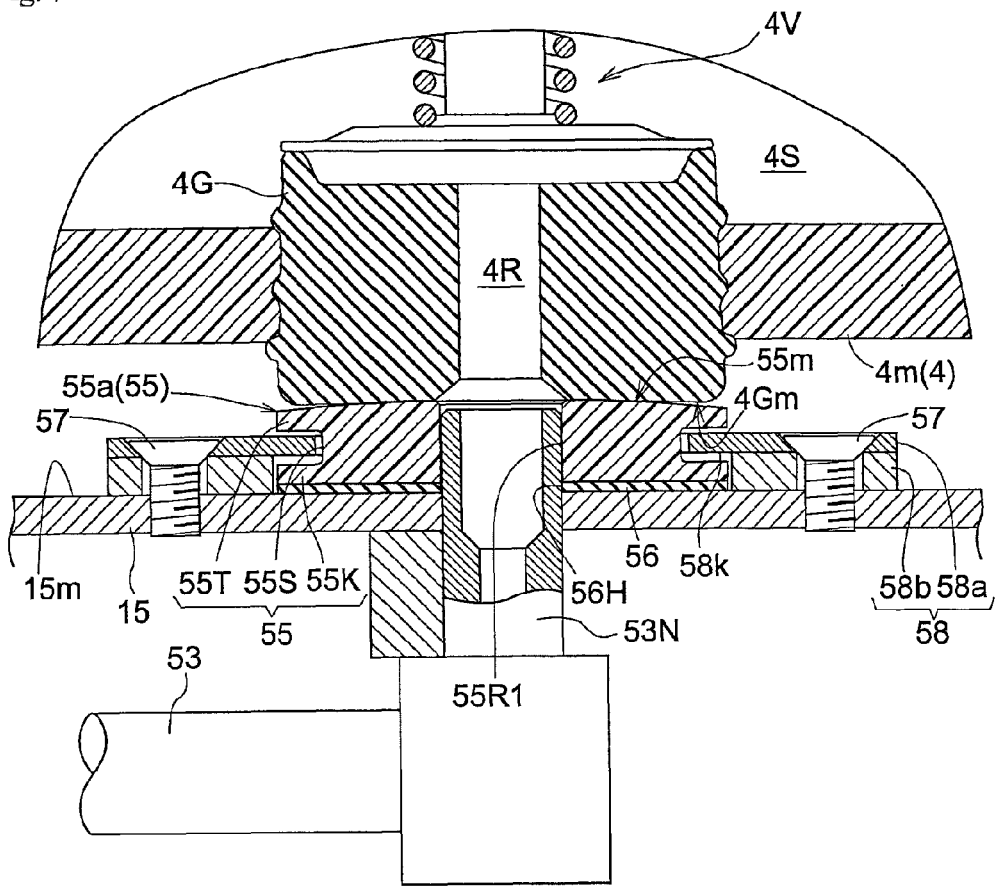
FIG. 7 is a drawing for explaining the state which the container side connecting portion and the support side connecting portion are in when the container is supported by the container support.

As shown in FIGS. 6 and 7, the support side connecting portion 55 includes a top portion 55T having the support side contact surface 55*m*, a smaller diameter portion 55S whose diameter is less than the diameter of the top portion 55T and is greater than the diameter of the supply hole 55R1 or of the discharge hole 55R2, and which, is continuous with, or adjoins the top portion 55T from below, and a leg portion 55K whose diameter is greater than that of the smaller diameter portion 55S and which is continuous with, or adjoins the smaller diameter portion 55S from below.

The attaching structure for attaching this support side connecting portion 55 to the container support 15 is shown in FIGS. 5-7.

As shown in FIG. 5, each of the two support side connecting portions 55*a* located toward the back side of the storage rack 10 is attached to the top surface 15*m* of the container support 15 by means of an attaching member 58. And each of the support side connecting portion 55*a* located on the right hand side and toward the front of the rack 10 and the support side connecting portion 55*b* located on the left hand side and toward the front is attached to the top surface 15*m* of the container support 15 by means of a attaching member 59.

Since the manner in which the support side connecting portion 55 is attached by means of the attaching member 58 is identical to the manner in which the support side connecting portion 55 by means of the attaching member 59, the manner in which the support side connecting portion 55 is attached by means of the attaching member 58 is described below.

The attaching member 58 consists of first attaching member 58*a* and second attaching member 58*b* which are annular and plate-shaped in shape in plan view.

The first attaching member 58*a* is formed to have a ring-shape whose thickness is less than the vertical dimension of the smaller diameter portion 55S, and whose inner diameter is less than the outer diameter of the top portion 55T and the outer diameter of the leg portion 55K, and whose outer diameter is greater than the outer diameter of the top portion 55T and the outer diameter of the leg portion 55K. In addition, the first attaching member 58*a* is divided into a plurality of sections (two sections in the present example) in the circumferential direction. Thus, the plurality of sections of the first attaching member 58*a* can be inserted into the smaller diameter portion 55S by moving them radially inwardly from different respective positions in the circumferential direction.

The vertical dimension of the second attaching member 58*b* is greater than the sum of the vertical dimension of the leg portion 55K and the vertical dimension of a sheet-shaped elastic member 56 described below. In addition, the inner diameter of the second attaching member 58*b* is dimensioned to be greater than the outer diameter of the leg portion 55K. And the outer diameter of the second attaching member 58*b* is dimensioned to be equal to the outer diameter of the first attaching member 58*a*. The second attaching member 58*b* is formed to have a ring shape. In addition, the first attaching member 58*a* and the second attaching member 58*b* have through holes that correspond to attaching screw holes formed in the container support 15.

The elastic member 56 is a ring-shaped rubber sheet (of material whose elastic modulus is smaller than that of PTFE which is the material of the support side connecting portion 55) which is thin and which has a hole 56H at the center through which the supply nozzle 53N is inserted. The radial dimension (i.e., the diameter) of the hole 56H is less than or equal to the outer tube diameter of the supply nozzle 53N.

Thus, the elastic member 56 is positioned or held between the support side connecting portion 55 and the container support 15. And the support side connecting portion 55 is made of material whose elastic modulus is greater than that of the elastic member 56.

And when attaching the support side connecting portion 55 to the container support 15, the support side connecting portion 55 is installed and positioned in place with the supply nozzle 53N extending through the hole 56H of the elastic member 56 and with the undersurface of the elastic member 56 contacting the top surface 15*m* of the container support 15.

Subsequently, the inner edge portion 58*k* of the first attaching member 58*a* is held between the top portion 55T and the leg portion 55K of the support side connecting portion 55, and is fitted into the smaller diameter portion 55S of the support side connecting portion 55 such that the inner edge portion 58*k* overlaps with both the top portion 55T and the leg portion 55K in plan view. Next, the second attaching member 58*b* is placed directly under the first attaching member 58*a* (i.e., on the leg portion 55K side). Screws 57 are then inserted into the through holes of the first attaching member 58*a* and the second attaching member 58*b*. And the first attaching member 58*a* and the second attaching member 58*b* are fastened and fixed to the container support 15 by means of the screws 57. When this is completed, the inner edge portion 58*k* is located at a height at which it overlaps with the smaller diameter portion 55S as seen in a side view.

Thus, the support side connecting portion 55 can be attached to the container support 15 such that the support side connecting portion 55 does not move from a prescribed position on the container support 15 in plan view while allowing the support side connecting portion 55 to move vertically over a distance that corresponds to the difference between the vertical dimension of the first attaching member 58*a* and the vertical dimension of the smaller diameter portion 55S.

Also, since the elastic member 56 is provided below the support side connecting portion 55, the support side connecting portion 55 is urged upwardly although it is allowed to move vertically; thus, the container side contact surface 4Gm which is the undersurface of the grommet 4G and the support side contact surface 55*m* which is the top surfaces of the support side connecting portion 55 can come into proper contact with each other.

In the present embodiment, the first attaching member 58*a* function as a restricting member whereas the inner edge portion 58*k* of the first attaching member 58*a* functions as an insert portion of the restricting member. In other words, the restricting member for restricting the movement of the support side connecting portion 55 in the horizontal direction and in the vertical direction to within a range defined in advance is provided in the peripheral area of the support side connecting portion 55. In addition, the restricting member has the inner edge portion 58*k* which is thinner, or has a smaller vertical dimension, than the vertical dimension of the smaller diameter portion 55S. And the inner edge portion 58*k* is provided such that it is located at a height at which it overlaps with the smaller diameter portion 55S as seen in a side view and such that it overlaps with both the top portion 55T and the leg portion 55K in plan view.

ALTERNATIVE EMBODIMENTS (1) In the embodiment described above, an example is described in which the support side contact surface 55*m* is formed to have a shape that conforms to the surface of a sphere that is upwardly convex. However, the support side contact surface 55m may be formed to have a shape which is lower in a liner fashion as the distance increases from the supply hole 55R1 or the discharge hole 55R2 (i.e., a conical shape), or a shape which conforms to a spheroid whose major axis or minor axis coincides with the axis of the supply hole 55R1 or the discharge hole 55R2.

(2) In the embodiment described above, an example is described in which a rubber sheet which functions as an elastic member 56 is held between the support side connecting portion 55 and the container support 15. However, the elastic member 56 is not limited to a rubber sheet. And any other material may be used as long as the elastic modulus of the material is less than that of the support side connecting portion 55 (PTFE in the embodiment described above). Or, for example, a spring, etc. may be interposed between the support side connecting portion 55 and the container support 15 such that sealing function is preserved.

(3) In the embodiment described above, an example is described in which the inner edge portion 58k of the first attaching member 58a is used as an insert portion. However, the invention is not limited to such arrangement. For example, the first attaching member 58a may be formed to have a ring shape whose inner diameter is greater than the outer diameters of the top portion 55T and the leg portion 55K. And rods that are thinner than the vertical dimension of the smaller diameter portion 55S and that project inwardly from two or more different circumferential locations along the inner edge of the first attaching member 58a may be used as the insert portion.

(4) In the embodiment described above, the support side connecting portion 55 includes the top portion 55T which is circular in shape in plan view and which has a support side contact surface 55m, the smaller diameter portion 55S whose diameter is less than the diameter of the top portion 55T and is greater than the diameter of the supply hole 55R1 or the discharge hole 55R2, and which is continuous with, or adjoins the top portion 55T from below, and the leg portion 55K whose diameter is greater than the diameter of the smaller diameter portion 55S and which is continuous with, or adjoins the smaller diameter portion 55S from below. However, the invention is not limited to such arrangement. For example, a support side contact surface 55m may be formed at the upper end of a cylindrical member. And a plate-shaped leg portion 55K whose diameter is greater than that of the cylindrical member may be formed at the lower end of the cylindrical member. In such case, for attaching the support side connecting portion 55 to the container support 15, an attaching member may be utilized which has a plate-shaped pressing portion whose diameter is greater than that of the leg portion 55K in plan view and which also has a hole into which the cylindrical portion can be inserted. More specifically, with the cylindrical portion inserted in the hole of the attaching member, the pressing portion is fixed to the container support 15 at a position spaced apart from the top surface 15m of the container support 15 by a distance that is greater than the sum of the vertical dimension of the leg portion 55K and the vertical dimension of the elastic member 56. This arrangement allows the support side connecting portion 55 to be fixed to the container support 15 while restricting the movement of the support side connecting portion 55 in the horizontal direction and in the vertical direction to within a range defined in advance.

(5) In the embodiment described above, an example is described in which the containers 4 are FOUPs for holding or storing the semiconductor substrates W. However the invention is not limited to this arrangement. For example, the containers 4 may hold or store food. And the gas being supplied may be gas that prevents or reduces oxidization. As such, a processing facility in accordance with the present invention is applicable to various kinds of processing facilities.

What is claimed is:

1. A processing facility comprising:
   a container for holding an object to be held therein;
   a container support for supporting the container from below with the container positioned in a set position, the container support having a top surface;
   a container side connecting portion which is provided in a bottom portion of the container and which has a communicating hole capable of allowing communication between an interior space of the container and outside the container;
   a support side connecting portion which is provided to the container support and which has a supply hole for supplying gas to the interior space of the container or a discharge hole for discharging gas from the interior space of the container, the support side connecting portion being annular in shape with the supply hole or the discharge hole formed in a center portion thereof; and
   a positioning pin provided upright on the top surface of the container support for positioning the container in a proper position when placing the container on the container support,
   wherein a container side contact surface which is an undersurface of the container side connecting portion and a support side contact surface which is a top surface of the support side connecting portion are configured to be in contact with each other and to allow communication between the supply hole or the discharge hole and the communicating hole, when the container is supported by the container support,
   wherein the container side contact surface is formed to be flat at least in a periphery of the communicating hole,
   wherein the support side contact surface is formed to have a shape that is gradually lower as a distance increases from the supply hole or the discharge hole,
   wherein the support side connecting portion is formed as a solid body which is annular in shape with the supply hole or the discharge hole formed in the center portion thereof,
   wherein an entirety of the support side connecting portion is located directly above the top surface of the container support such that the container support supports the support side connecting portion against a force applied to the support side connecting portion by the container side connecting portion when the container is supported by the container support, and
   wherein an elastic sheet member is held between the support side connecting portion and the top surface of the container support, and wherein the support side connecting portion is made of material having an elastic modulus that is greater than an elastic modulus of the elastic sheet member.

2. The processing facility as defined in claim 1, wherein the support side contact surface is formed to have a shape that conforms to a surface of a sphere.

3. The processing facility as defined in claim 1, wherein a restricting member is provided in a periphery of the support side connecting portion and above the top surface of the container support, for restricting movement of the support side connecting portion in a horizontal direction and in a vertical direction to within a range defined in advance.

4. The processing facility as defined in claim 3, wherein: the range defined in advance is such as to allow the vertical movement of the support side connecting portion only by an amount that corresponds to an elastic deformation of the elastic member.

5. The processing facility as defined in claim 3,
wherein the support side connecting portion includes a top portion which is circular in shape in plan view and which has the support side contact surface, a smaller diameter portion whose diameter is less than a diameter of the top portion and is greater than a diameter of the supply hole or the discharge hole, and which adjoins the top portion from below, and a leg portion whose diameter is greater than the diameter of the smaller diameter portion and which adjoins the smaller diameter portion from below, wherein the restricting member has an insert portion which is thinner than a vertical dimension of the smaller diameter portion, and
wherein the insert portion is provided such that the insert portion is located at a height at which the insert portion overlaps with the smaller diameter portion in a side view, such that the insert portion overlaps with both the top portion and the leg portion in plan view, and such that the entire insert portion is located directly above the top surface.

6. The processing facility as defined in claim 1, wherein a surface roughness of the support side contact surface is such that an arithmetic mean roughness (Ra) is within a range of 3.2 micrometers to 6.3 micrometers.

7. The processing facility as defined in claim 1, wherein the support side connecting portion defines the supply hole or the discharge hole such that the support side contact surface extends from a perimeter edge of the supply hole or the discharge hole to an outer edge of the support side connecting portion and is arcuate-shaped and upward-facing from the perimeter edge to the outer edge.

8. The processing facility as defined in claim 1, wherein the container side connecting portion is inserted in a hole formed in a bottom of the container and is formed as a solid body which is annular in shape with the communication hole formed in a center portion thereof.

9. A processing facility comprising:
a container for holding an object to be held therein;
a container support for supporting the container from below with the container positioned in a set position, the container support having a top surface;
a container side connecting portion which is provided in a bottom portion of the container and which has a communicating hole capable of allowing communication between an interior space of the container and outside the container;
a support side connecting portion which is provided to the container support and which has a supply hole for supplying gas to the interior space of the container or a discharge hole for discharging gas from the interior space of the container, the support side connecting portion being annular in shape with the supply hole or the discharge hole formed in a center portion thereof; and
a positioning pin provided upright on the top surface of the container support for positioning the container in a proper position when placing the container on the container support;
a restricting member provided in a periphery of the support side connecting portion and above the top surface of the container support, for restricting movement of the support side connecting portion in a horizontal direction and in a vertical direction to within a range defined in advance, the restricting portion including an insert portion that engages the support side connecting portion with an entirety of the insert portion being located directly above the top surface;
wherein a container side contact surface which is an undersurface of the container side connecting portion and a support side contact surface which is a top surface of the support side connecting portion are configured to be in contact with each other and to allow communication between the supply hole or the discharge hole and the communicating hole, when the container is supported by the container support,
wherein the container side contact surface is formed to be flat at least in a periphery of the communicating hole,
wherein the support side contact surface is formed to have a shape that is gradually lower as a distance increases from the supply hole or the discharge hole, and
wherein an entirety of the support side connecting portion is located directly above the top surface of the container support such that the container support supports the support side connecting portion against a force applied to the support side connecting portion by the container side connecting portion when the container is supported by the container support.

10. The processing facility as defined in claim 9,
wherein the support side connecting portion includes a top portion which is circular in shape in plan view and which has the support side contact surface, a smaller diameter portion whose diameter is less than a diameter of the top portion and is greater than a diameter of the supply hole or the discharge hole, and which adjoins the top portion from below, and a leg portion whose diameter is greater than the diameter of the smaller diameter portion and which adjoins the smaller diameter portion from below, wherein the restricting member has an insert portion which is thinner than a vertical dimension of the smaller diameter portion, and
wherein the insert portion is provided such that the insert portion is located at a height at which the insert portion overlaps with the smaller diameter portion in a side view, such that the insert portion overlaps with both the top portion and the leg portion in plan view, and such that the entire insert portion is located directly above the top surface.

11. The processing facility as defined in claim 9, wherein the support side connecting portion is formed as a solid body which is annular in shape with the supply hole or the discharge hole formed in a center portion thereof.

12. The processing facility as defined in claim 9, wherein the support side connecting portion defines the supply hole or the discharge hole such that the support side contact surface extends from a perimeter edge of the supply hole or the discharge hole to an outer edge of the support side connecting portion and is arcuate-shaped and upward-facing from the perimeter edge to the outer edge.

13. The processing facility as defined in claim 9, wherein the container side connecting portion is inserted in a hole formed in a bottom of the container and is formed as a solid body which is annular in shape with the communication hole formed in a center portion thereof.

14. The processing facility as defined in claim 9, wherein:
an elastic member is held between the support side connecting portion and the top surface of the container support, and the range defined in advance is such as to allow the vertical movement of the support side connecting portion only by an amount that corresponds to an elastic deformation of the elastic member.

\* \* \* \* \*